(12) United States Patent
Bayan

(10) Patent No.: US 8,222,716 B2
(45) Date of Patent: Jul. 17, 2012

(54) MULTIPLE LEADFRAME PACKAGE

(75) Inventor: Jaime A. Bayan, San Francisco, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 237 days.

(21) Appl. No.: 12/581,065

(22) Filed: Oct. 16, 2009

(65) Prior Publication Data

US 2011/0089546 A1    Apr. 21, 2011

(51) Int. Cl.
*H01L 23/495* (2006.01)
*H01L 21/00* (2006.01)

(52) U.S. Cl. . 257/666; 257/676; 257/686; 257/E21.499; 257/E23.141; 438/112; 438/123

(58) Field of Classification Search .................. 257/670, 257/676, 686, E23.141, E21.499, E21.51; 438/111, 112, 123, 124
See application file for complete search history.

(56) References Cited

U.S. PATENT DOCUMENTS

| | | | |
|---|---|---|---|
| 3,915,729 A * | 10/1975 | Eustice | 106/268 |
| 5,926,695 A | 7/1999 | Chu et al. | |
| 5,994,768 A | 11/1999 | Fogelson | |
| 6,061,251 A | 5/2000 | Hutchison et al. | |
| 6,064,115 A | 5/2000 | Moscicki | |
| 6,066,515 A | 5/2000 | Schoenfeld | |
| 6,072,228 A | 6/2000 | Hinkle et al. | |
| 6,215,176 B1 | 4/2001 | Huang | |
| 6,372,579 B1 | 4/2002 | Tung | |
| 6,448,107 B1 | 9/2002 | Hong et al. | |
| 6,483,180 B1 | 11/2002 | Bayan et al. | |
| 6,603,197 B1 * | 8/2003 | Yoshida et al. | 257/676 |

(Continued)

FOREIGN PATENT DOCUMENTS

JP    06-177315    6/1994

OTHER PUBLICATIONS

Search Report dated Feb. 28, 2011 from International Application No. PCT/US2010/045802.
Written Opinion dated Feb. 28, 2011 from International Application No. PCT/US2010/045802.
Search Report dated Feb. 28, 2011 from International Application No. PCT/US2010/045803.
Written Opinion dated Feb. 28, 2011 from International Application No. PCT/US2010/045803.

*Primary Examiner* — Tuan N. Quach
(74) *Attorney, Agent, or Firm* — Eugene C. Conser; Wade J. Brady, III; Frederick J. Telecky, Jr.

(57) ABSTRACT

Apparatuses and methods directed to a semiconductor chip package having multiple leadframes are disclosed. Packages can include a first leadframe having a die attach pad and a first plurality of electrical leads, a second leadframe that is generally parallel to the first leadframe and having a second plurality of electrical leads, and a plurality of direct electrical connectors between the first and second leadframes, where such direct electrical connectors control the distance between the leadframes. Additional device components can include a primary die, an encapsulant, a secondary die, an inductor and/or a capacitor. The plurality of direct electrical connectors can comprise polymer balls having solder disposed thereabout. Alternatively, the direct electrical connectors can comprise metal tabs that extend from one leadframe to the other. The first and second leadframes can be substantially stacked atop one another, and one or both leadframes can be leadless leadframes.

20 Claims, 15 Drawing Sheets

U.S. PATENT DOCUMENTS

| | | |
|---|---|---|
| 7,687,899 B1 | 3/2010 | Berry |
| 7,842,541 B1 * | 11/2010 | Rusli et al. .................... 438/106 |
| 8,026,589 B1 * | 9/2011 | Kim et al. ..................... 257/690 |
| 2002/0024857 A1 | 2/2002 | Stave |
| 2003/0209804 A1 | 11/2003 | Knapp et al. |
| 2005/0260795 A1 * | 11/2005 | Park et al. ..................... 438/111 |
| 2007/0001274 A1 | 1/2007 | Hinkle et al. |
| 2007/0181990 A1 * | 8/2007 | Huang et al. .................. 257/686 |

* cited by examiner

MULTIPLE LEADFRAME PACKAGE

TECHNICAL FIELD

The present invention relates generally to the packaging of integrated circuit devices, and more particularly to the use of leadframe packages for multiple chip modules, system in package arrangements, or other complex components.

BACKGROUND

Many integrated circuit ("IC") device packages utilize a metal leadframe to provide electrical interconnects between an integrated circuit die and external components. Such leadframes generally include numerous metal leads that extend away from a die and that are contained within the same general plane, so as to facilitate the ready manufacture of the same leadframe in mass quantities. Many leadframes also include a die attach pad ("DAP") within the same general plane as the metal leads, typically at or near their center. The DAP can support the die during assembly of the package, provide a ground or other electrical contact for the package, and can also help with thermal management of the package by providing a good thermal conduction path for dissipating excess heat generated by the die.

While early leadframe designs typically provided a DAP and metal electrical leads for a single die, technological advances have resulted in more complex components than single die packages. Complex components that can utilize leadframes include, for example, the multi-chip module ("MCM") and system in package ("SIP") IC arrangements, among others. Both MCMs and SIPs can have multiple chips and/or other components all within a single package, which tends to result in savings in both space and cost with respect to traditional arrangements that would include all of the same or similar chips or components, typically spread out across multiple packaged components.

Although MCMs and SIPs represent improvements over simpler conventional IC designs, these relatively complex devices do require many electrical contacts in a restricted amount of space. The generally planar nature of a traditional single leadframe, when combined with this complexity of an MCM or SIP, can result in a sophisticated device that still has a rather large footprint in comparison with other IC devices. As will be generally understood, it is typically not desirable to have IC devices that present relatively large footprints, particularly when it comes to portable devices, such as cellular telephones, personal digital assistants, media play devices, and the like. IC device packages that result in smaller device footprints are generally desirable, since smaller device footprints tend to result in greater assembly yields and reduced unit costs. Examples of packages that utilize more advanced leadframe structures, such as for more complex IC arrangements, can be found at, for example, U.S. Pat. Nos. 5,994,768; 6,072,228; and 6,215,176, among other similar references. Of course, the introduction of multi-layer and/or multi-part leadframe structures, such as those in the foregoing references, tends to result in additional problems and issues that are not found in simpler leadframe arrangements. Such issues can include problems with thermal and/or parasitic dissipation, among others.

While many of the devices and techniques used to package IC devices have generally worked well in the past, there is always a desire to provide improved ways for packaging IC devices. In particular, complex leadframe based packages for MCMs, SIPs or other complex IC structures that provide reliable performance and suitable thermal and parasitic dissipations within a relatively small overall footprint are desired.

SUMMARY

It is an advantage of the present invention to provide improved packages for complex integrated circuit arrangements that utilize a leadframe while still managing to occupy a small footprint for the overall chip package. This can be accomplished at least in part through the use of a plurality of separate leadframes arranged in a stacked formation with respect to each other and a primary die. Reliability of and small overall spacing for these complex multiple leadframe packages are maintained at least in part due to a plurality of electrical connectors between two separate leadframes that directly connect the respective leadframes.

In various embodiments, an integrated circuit device or package includes a first leadframe, a second leadframe parallel to and separate from the first leadframe, and a plurality of direct electrical connectors between the first and second leadframes. The first leadframe generally defines a first plane and has a die attach pad adapted to couple to an associated primary die and a first plurality of electrical leads adapted to couple to one or more contacts on the associated primary die. The second leadframe generally defines a second plane substantially parallel to and separated from the first plane, and the second leadframe has a second plurality of electrical leads adapted to couple to one or more contacts on the associated primary die, the first leadframe, or both. In addition to providing direct electrical contacts between the first and second leadframes, the plurality of direct electrical connectors also control the distance between the first and second leadframes.

In some embodiments, the distance between leadframes can remain constant at substantially all locations of both leadframes. In other embodiments, various portions of one or both leadframes can be downset or otherwise offset from their respective leadframe planes, and the distance between leadframes can vary from region to region. In such embodiments, the distance between leadframes at various regions can still be controlled by the plurality of direct electrical connectors, with the direct electrical connectors varying by type and/or dimension depending upon the particular distance or offset between leadframes at their respective locations.

In various embodiments, the first and second leadframes can be arranged in a stacked formation atop one another, which stacked formation may also accommodate the associated primary die. Further embodiments can include the associate primary die itself, a secondary integrated circuit component, such as a second die, capacitor, inductor or daughterboard, and/or an encapsulant or molding that binds and protects various portions of the leadframes, primary die, secondary die, other components and/or plurality of direct electrical connectors. In addition, one or both leadframes can be leadless leadframes.

In some embodiments, the plurality of direct electrical connectors can comprise one or more balls having solder or another similar material therein. Such balls can also include a polymer material, such that the structural rigidity of the ball is maintained when the solder or other similar material is reflowed. Because the structural rigidity of these plurality of poly-balls is maintained during a reflow procedure, the height of the balls can be used to control the distance between the first and second leadframes.

In some embodiments, the plurality of direct electrical connectors can comprise one or more metal tabs that extend from one leadframe to the other. In such metal tab arrangements, at least one end of each of the metal tabs can be soldered or welded to one of the leadframes. In some arrangements, the tabs can be integrally formed with one leadframe, such that the tab is bent or otherwise directed downward, with its end being soldered or ultrasonically welded to the other leadframe. Such single end soldered tabs can be generally n-shaped or s-shaped in nature. In some arrangements the tabs can be n-shaped, with the distal end abutting the opposing leadframe, while in some arrangements the tabs can be s-shaped, with the distal end running alongside the opposing leadframe. Under either type of tab, the tabs generally provide enough structural rigidity such that the distance between the leadframes is controlled by the tabs.

In various embodiments, at least one electrical connection to a contact on the primary associated die can follow a path that traverses along a portion of one leadframe, then across one of the plurality of direct electrical connectors to the other leadframe, then along a portion of the other leadframe, the across another of the plurality of direct electrical connectors back to the original leadframe, and then along another portion of the original leadframe.

Still further embodiments can include various methods of manufacturing an integrated circuit device having a multiple leadframe package. Such methods can include the steps of creating a first leadframe having a die attach pad and a first plurality of electrical leads, forming a plurality of direct electrical connectors directly onto the first leadframe, attaching a first die to the die attach pad, creating a second leadframe having a second plurality of electrical leads, attaching a secondary integrated circuit component to the second leadframe, placing the second leadframe atop the plurality of direct electrical connectors formed on the first leadframe, reflowing a portion of at least some of the plurality of direct electrical connectors such that the second leadframe is bonded to the first leadframe, and providing an encapsulant around various portions of the first die, first leadframe, second leadframe, plurality of direct electrical connectors, and secondary integrated circuit component. As in the above embodiments, the plurality of reflowed direct electrical connectors can control the distance between the first and second leadframes. Also, the secondary integrated circuit component can be a second die, capacitor, inductor or daughterboard.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for providing reliable multiple leadframe stack packages. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

Figure 1A:
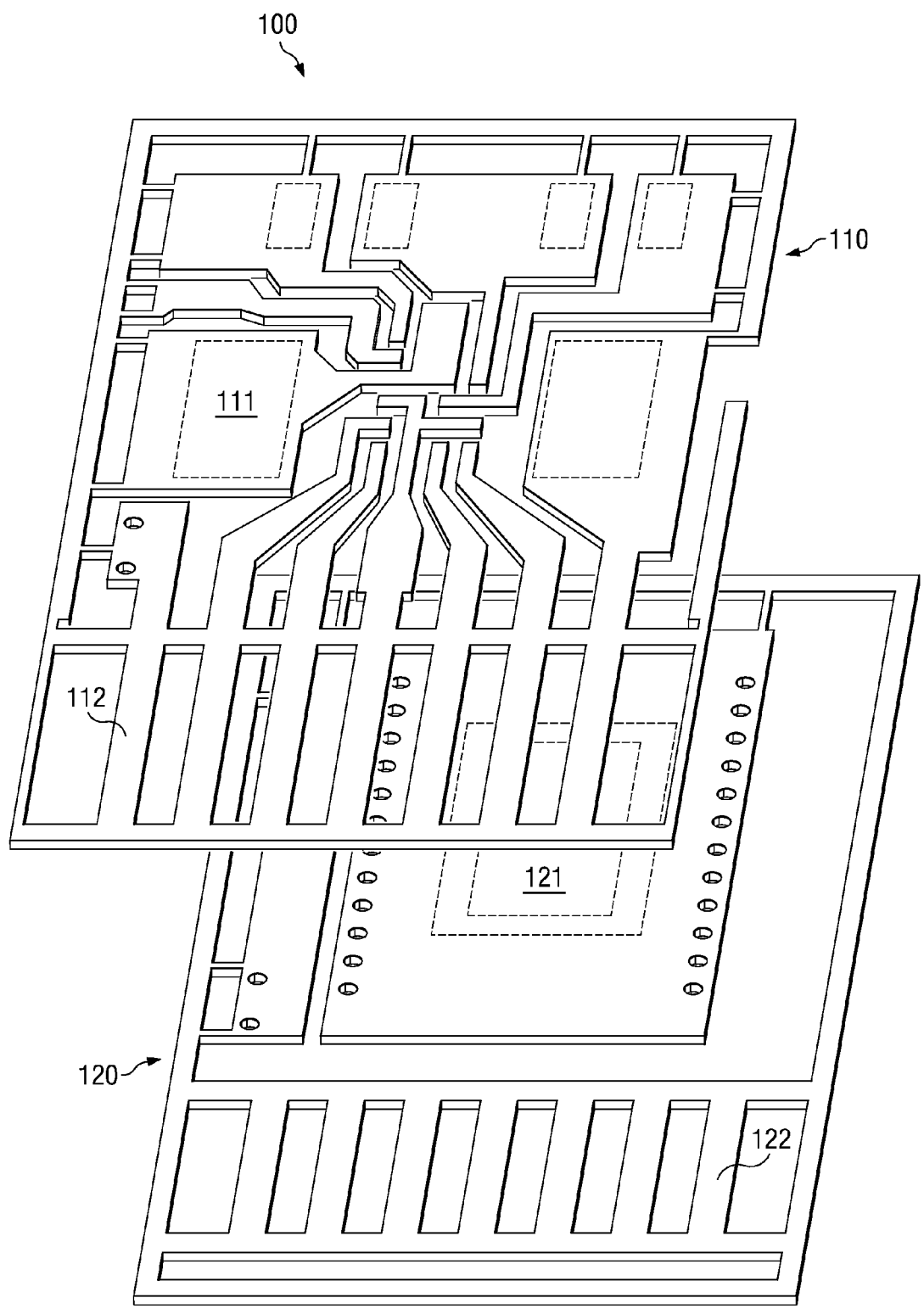
FIG. 1A illustrates in exploded top perspective view an exemplary partial multiple leadframe package according to one embodiment of the present invention.
Figure 1B:
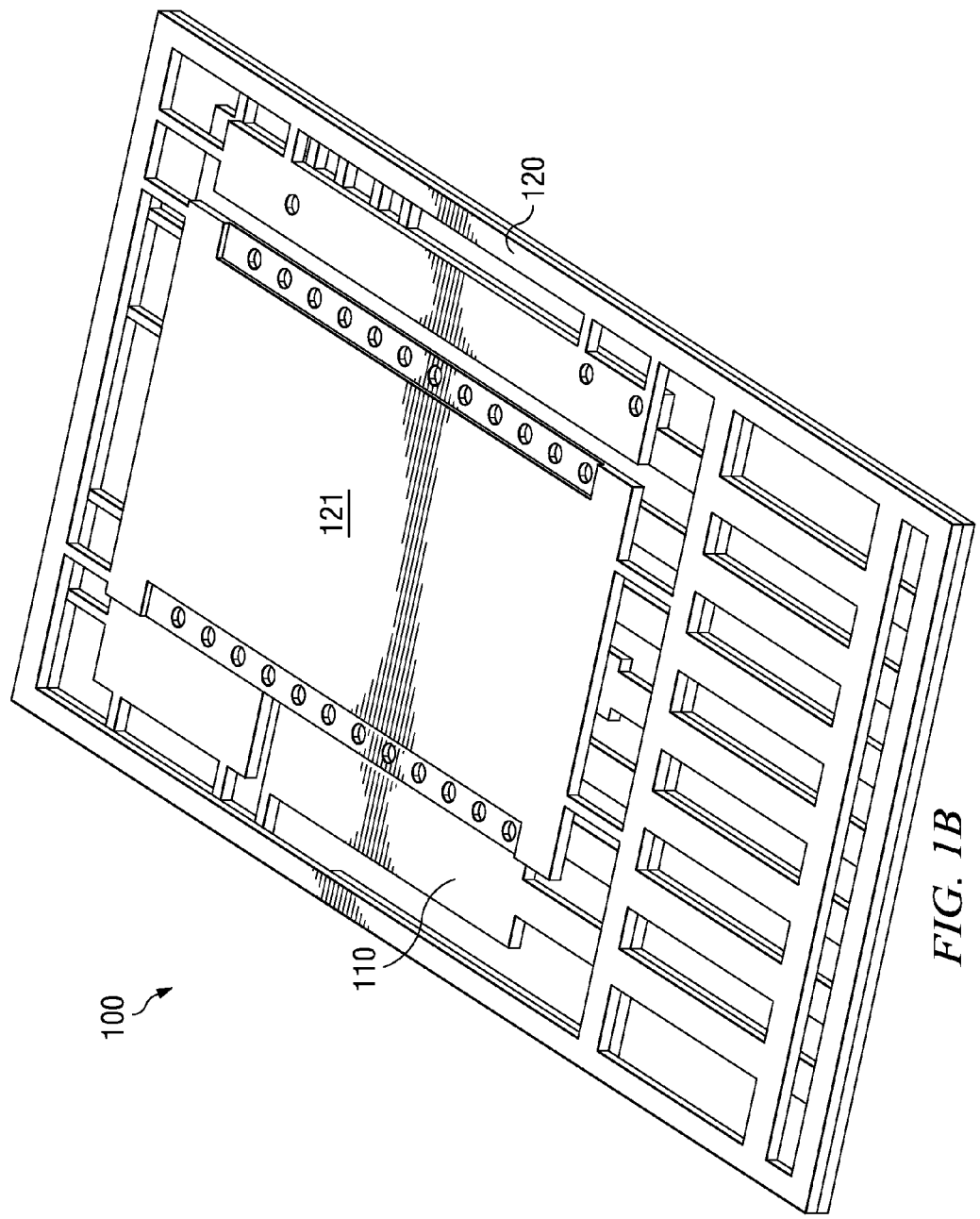
FIG. 1B illustrates in bottom perspective view the partial multiple leadframe package of FIG. 1A according to one embodiment of the present invention.

Referring first to FIGS. 1A and 1B, an exemplary partial multiple leadframe package is shown in exploded top perspective and bottom perspective views respectively. Partial multiple leadframe package 100 generally includes a top leadframe 110 and bottom leadframe 120. Although other components should be added for partial leadframe package 100 to be functional, just the separate and spaced apart first and second leadframes 110, 120 are depicted in FIGS. 1A and 1B for purposes of simplicity. As shown, top or first leadframe 110 can have one or more component attach pads 111, as well as a first plurality of electrical leads 112. Similarly, bottom or second leadframe 120 can have a die attach pad 121, as well as a second and separate plurality of electrical leads 122. While FIG. 1A shows the two leadframes 110, 120 as being apart and separated by some distance, FIG. 1B depicts a reverse angle of the two leadframes positioned atop and with respect to each other as would be appropriate for an actual packaged application.

As will be readily appreciated, top or first leadframe 110 can generally define a first plane, while bottom or second leadframe 120 can generally define a second plane that is substantially parallel to and separated from the first plane. While some parts or portions of either leadframe may diverge from their respective general planes, such as in the case of, for example, downset regions, upturned edges, and/or certain tabs, half-stamps or embosses described in greater detail below, the nature of a traditional leadframe is that a substantial portion of the leadframe resides in the same general plane. As can also be seen from the intended final respective positions in FIG. 1B, first leadframe 110 and second leadframe 120 are "stacked" with respect to one another, and also with respect to various other IC components that are to be included in a final device, such as, for example, a primary die, a secondary die, one or more inductors, one or more capacitors and the like.

In addition, one or both of first leadframe 110 and second leadframe 120 can be leadless leadframes, such as any of the variety of the leadless leadframes designed and manufactured by National Semiconductor Corporation of Santa Clara, Calif. Details regarding leadless leadframes can be found at, for example, U.S. Pat. Nos. 6,372,579 and 6,448,107, which are incorporated herein by reference. Of course, other suitable leadframe packages may also be used, and it will be understood that the present invention can be used with traditional or leadless leadframes. While the detailed description herein depicts leadless leadframes, such references are for purposes of illustration only, and it will be appreciated that the disclosed apparatuses and methods can be adapted for use with other leadframe packaging types.

Figure 2A:
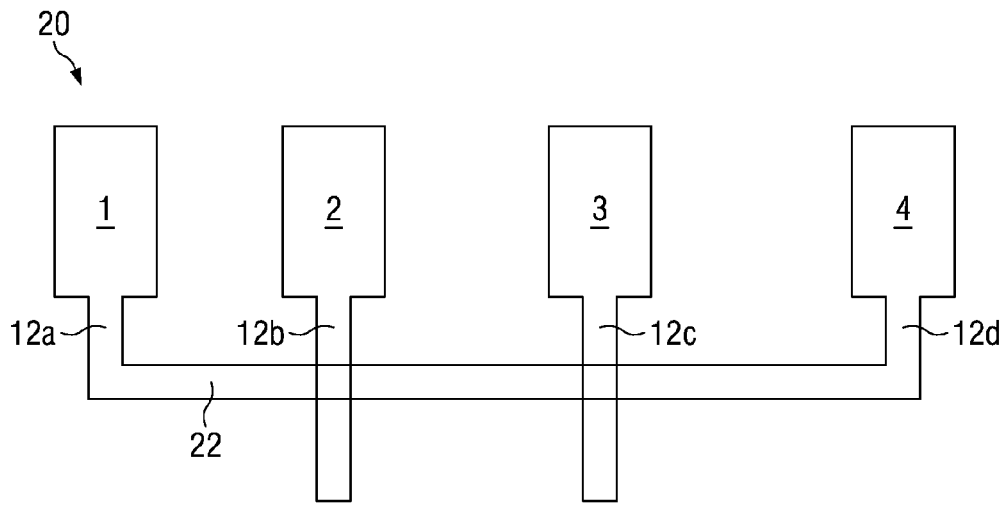
FIG. 2A illustrates in top plan view a plurality of electrical contacts and associated leads arranged in a single leadframe package.
Figure 2B:
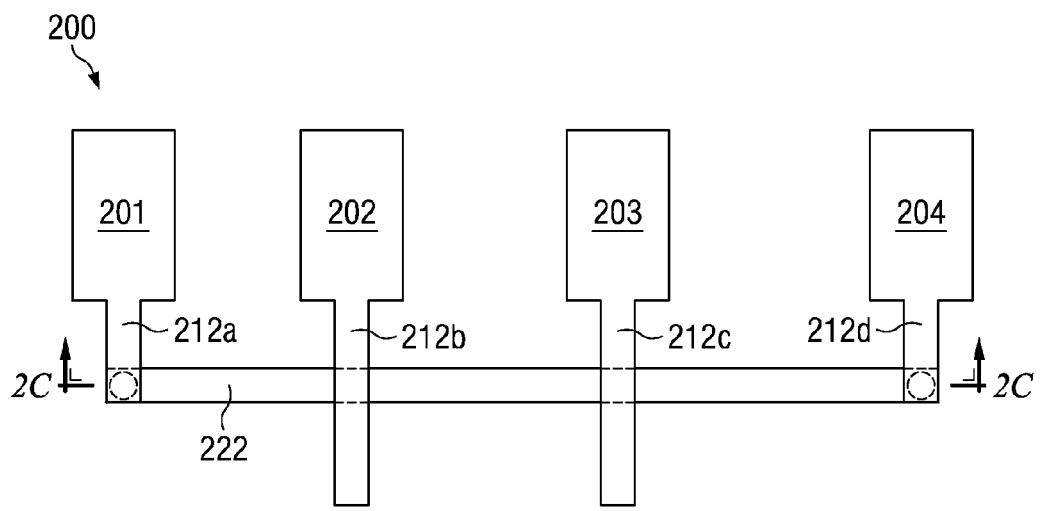
FIG. 2B illustrates in top plan view an exemplary plurality of electrical contacts and associated leads similar to those of FIG. 2A, but arranged in a multiple leadframe package according to one embodiment of the present invention.
Figure 2C:
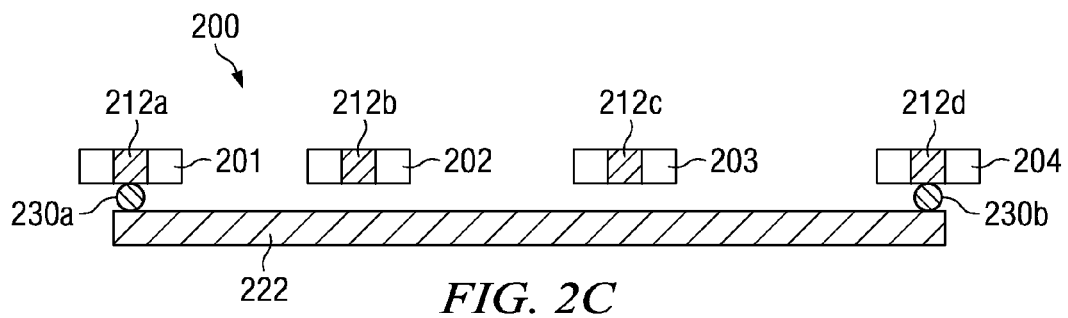
FIG. 2C illustrates in side cross-sectional view the plurality of electrical contacts and associated leads of FIG. 2B with a plurality of direct electrical connectors therebetween according to one embodiment of the present invention.

FIGS. 2A-2C collectively show some of the added flexibility introduced by way of having a multiple leadframe package, such as that which is shown in FIGS. 1A and 1B. an exemplary illustrates in top plan view a plurality of electrical contacts and associated leads arranged in a single leadframe package. FIG. 2A illustrates in top plan view a plurality of electrical contacts and associated leads arranged in a conventional single leadframe package. Partial single leadframe package 20 includes a plurality of electrical contacts 1, 2, 3, 4 that are coupled respectively to electrical traces 12a, 12b, 12c, 12d. In the event that a particular design calls for contact 1 to couple to contact 4, a simple and direct electrical trace 22 from trace 12a to trace 12d would need to traverse non-involved traces 12b and 12c. This presents a problem where inclusion of electrical contacts 2 and 3 is not desired with respect to the coupling of contacts 1 and 4. Accordingly, a more complex design than a simple and direct electrical trace 22 is requires for single leadframe package 20.

FIG. 2B presents in top plan view an exemplary plurality of electrical contacts and associated leads similar to those of FIG. 2A, but arranged in a multiple leadframe package according to one embodiment of the present invention. As can be seen, partial multiple leadframe package 200 of FIG. 2B generally corresponds to the partial single leadframe package 20 of FIG. 2A. Electrical contacts 201, 202, 203 and 204 are coupled to electrical traces 212a, 212b, 212c and 212d respectively. In the event that a particular design calls for contact 201 to couple to contact 204, however, a relatively simple and more direct electrical connection can be made in multiple leadframe package 200. In particular, electrical trace 222 resides on a separate leadframe located on a different plane than the plane of the leadframe that holds each of electrical contacts 201, 202, 203, 204 and electrical traces 212a, 212b, 212c, 212d.

This two plane relationship can be seen better in FIG. 2C, which illustrates the plurality of electrical contacts and associated leads of FIG. 2B with a plurality of direct electrical connectors therebetween in side cross-sectional view. It will be readily appreciated that the arrangement depicted can be identical to or at least representative of various arrangements that can be provided in the dual leadframe arrangement of FIGS. 1A and 1B. As shown, electrical contacts 201, 202, 203, 204 and corresponding electrical traces 212a, 212b, 212c, 212d all reside on a top or first leadframe, while electrical trace 222 resides on a bottom or separate leadframe that is separate and spaced apart from the top or first leadframe. Direct electrical connectors 230a and 230b are used to route the electrical connection from contact 201 to contact 204 by way of electrical trace 222. In particular, an electrical connection can follow a path that traverses from contact 201 to electrical trace 212a on the first leadframe, then across direct electrical connector 230a to electrical trace 222 of the second leadframe, along electrical trace 222, then across direct electrical connector 230b back to electrical trace 212d on the original first leadframe, and then along electrical trace 212d to contact 204. Notably, electrical traces 212b and 212c are bypassed while the electrical connection still takes a rather direct route from contact 201 to contact 204, which illustrates some of the versatility of using such a dual leadframe.

Figure 3A:
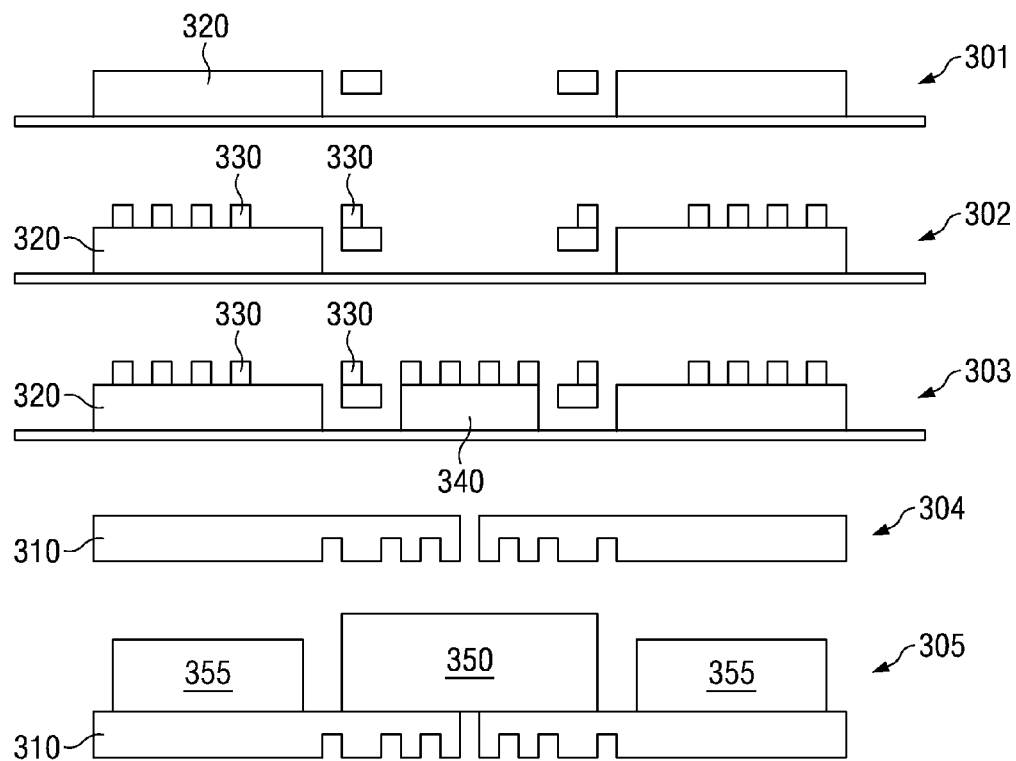
FIG. 3A illustrates in side cross-sectional view an exemplary series of components and process phases used to create a multiple leadframe IC device according to one embodiment of the present invention.

Turning next to FIG. 3A, an exemplary series of components and process phases used to create a multiple leadframe IC device according to one embodiment of the present invention is illustrated in side cross-sectional view. Phase 301 involves the creation of a bottom leadframe 320, which can be a conventional or leadless leadframe, as may be desired for a particular application. Phase 302 involves the addition of a plurality of direct electrical connectors 330 atop various locations of bottom leadframe 320. Such direct electrical connectors can be, for example, balls or tabs, such as those set forth in greater detail below. In the event that some or all of the direct electrical connectors are tabs, a suitable tab bending process can be used to "tab" the bottom leadframe 320 accordingly. In the event that some or all of the direct electrical connectors are balls, a suitable balling machine can be used to "ball" the bottom leadframe 320 accordingly. Phase 303 involves attaching a primary die to the bottom leadframe, such as in a "dead bug" arrangement.

Phase 304 involves the creation of a top leadframe 310, which is preferably designed to mate and interact with the bottom leadframe 320. Phase 305 then involves the addition of one or more secondary IC components to the top leadframe, such as inductor 350 and two capacitors 355, among other numerous possibilities and arrangements. Additional phases not depicted can include the bonding of the top leadframe 310 to the bottom leadframe 320, such as by reflowing some or all of the direct electrical connectors 330, and then the addition of an encapsulant around the various package components.

Figure 3B:
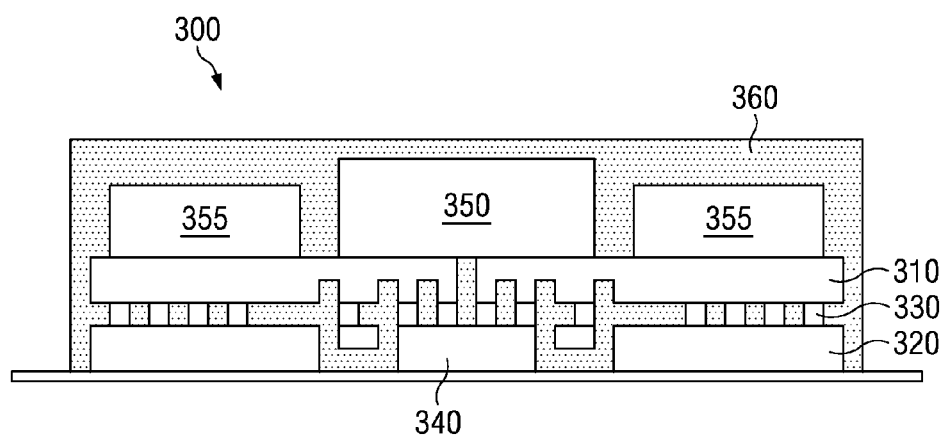
FIG. 3B illustrates in side cross-sectional view an exemplary multiple leadframe IC device resulting from the series of components and process phases depicted in FIG. 3A according to one embodiment of the present invention.

The completed device is provided in FIG. 3B, which illustrates in side cross-sectional view the exemplary multiple leadframe IC device resulting from the series of components and process phases depicted in FIG. 3A. As shown, SIP 300 includes a top or first leadframe 310, a bottom or second leadframe 320, a plurality of direct electrical connectors 330, a primary die 340, an inductor 350, two capacitors 355 and an encapsulant 360 that surrounds all or most of these various components. As will be readily appreciated, IC device or SIP 300 can have significantly more and varied components without departing from the basic nature of the dual stacked leadframe arrangement presented. Furthermore, one or more secondary or additional dice can be added, either in addition to or instead of the inductor 350 and/or capacitors 355, such that effectively a resulting MCM is formed.

Various suitable encapsulating or molding techniques can be used. One possibility is the use of a film assisted molding ("FAM") process, which can result in the exposure of contact pads on both sides of the finished SIP or MCM, as will be readily appreciated by those skilled in the art. The result of such a FAM process is that components can advantageously be attached to both sides of the finished product.

In some embodiments, encapsulant 360 can be provided after all other parts have been put into place, such that the resulting SIP 300 is formed as shown. In other embodiments, an encapsulant or molding can be provided at one or more different stages in the SIP or MCM formation process. For example, an encapsulant can be provided at a formation stage that includes both leadframes and all direct electrical connectors and components therebetween, but before the provision of secondary or additional components formed outside of both leadframes, such as the added inductor 350 or capacitors 355. If desired, an optional second encapsulant can then be provided over the secondary or additional components after these are added. A third and further encapsulant stages might also be introduced in the event of third and additional leadframes and components.

Figure 3C:
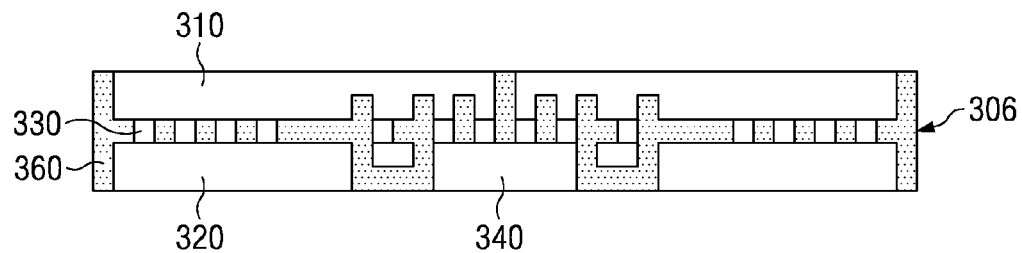
FIG. 3C illustrates in side cross-sectional view an alternative exemplary multiple leadframe IC device resulting from an alternative series of process phases of those depicted in FIG. 3A according to one embodiment of the present invention.
Figure 3D:
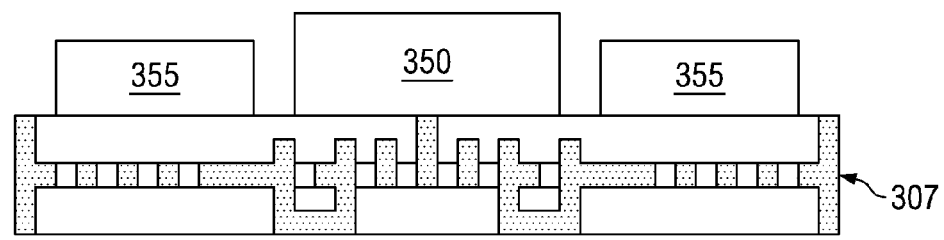
FIG. 3D illustrates in side cross-sectional view the alternative exemplary multiple leadframe IC device of 3C after further processing according to one embodiment of the present invention.

An example of such an alternative process is shown in FIGS. 3C and 3D, which illustrate in side cross-sectional view an alternative exemplary multiple leadframe IC device resulting from an alternative series of process phases of those depicted in FIG. 3A according to one embodiment of the present invention. As shown in phase 306 of FIG. 3C, the same or similar top leadframe 310, bottom leadframe 320, direct electrical connectors 330 and primary die 340 are all formed together, after which a first stage encapsulant 361 is then added to the partially formed SIP or MCM. Subsequent phase 307 is then provided in FIG. 3D, with inductor 350 and capacitors 355 being formed atop the top leadframe after first stage encapsulant 361 is formed. An additional encapsulant (not shown) can be provided around inductor 350, capacitors 355 and any further added components if desired, although such an additional encapsulant is optional and not necessary.

Such a multi-stage encapsulation process can result in a more robust manufacturing and handling process. For example, the partially formed and encapsulated product at stage 306 in FIG. 3C can be tested for defects or problems prior to the addition of any further components. This can save on time and costs associated with the formation of added component where the initially encapsulated product is unfit for further production. In addition, the product shown at stage 307 can also be tested, and any faulty or problematic added components can possibly be reworked without needing to scrap the base product of stage 306. Of course, such reworks or savings can be difficult or impossible where the entire product is encapsulated at once as shown in FIG. 3B.

Figure 4:
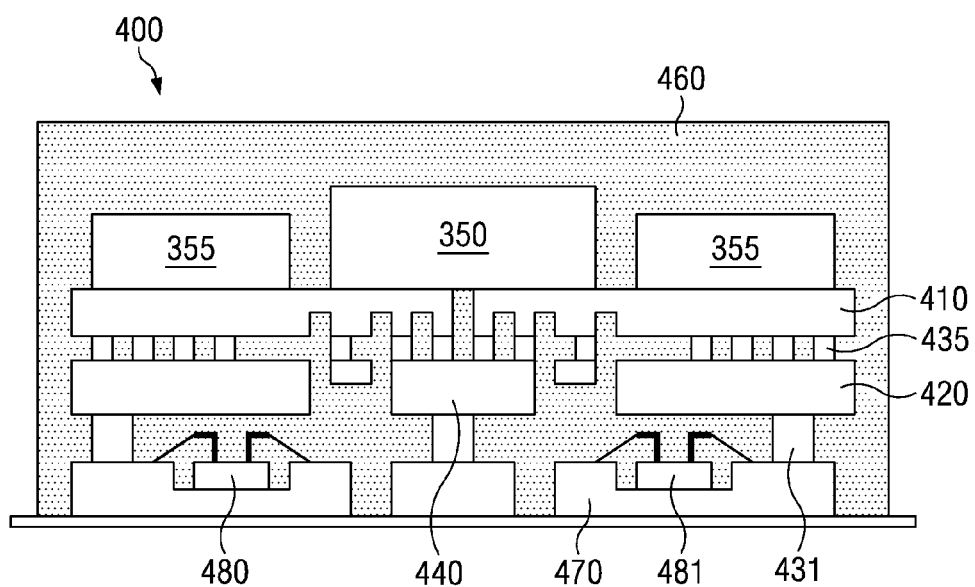
FIG. 4 illustrates in side cross-sectional view an alternative exemplary multiple leadframe IC device having a third leadframe according to one embodiment of the present invention.

An example of a somewhat more complex device is presented in FIG. 4, which illustrates in side cross-sectional view an alternative exemplary multiple leadframe IC device having a third leadframe according to one embodiment of the present invention. MCM 400 can be similar to the exemplary SIP 300 above in that the MCM includes a first leadframe 410, a second leadframe 420, a first plurality of direct electrical connectors 435 that directly couple the first and second leadframes, a primary die 440, an inductor 450, two capacitors 455 and an encapsulant 460. In addition, MCM 400 includes a third leadframe 470, a second plurality of direct electrical connectors 431 that directly couple the second and third leadframes, and one or more secondary dice 480, 481 wirebonded to third leadframe 470.

Again, it will be readily appreciated that MCM 400 is merely exemplary for purposes of illustration, and that a wide variety of devices and arrangements can be included in an MCM having three or more leadframes. Similar to the foregoing dual leadframe embodiments, the three separate and spaced apart leadframes 410, 420, 470 of MCM 400 all generally define planes that are arranged in stacked and parallel fashion, with some or all of the associated IC components also residing within the same general stack. While MCM 400 has been illustrated as having three separate leadframes and SIP 300 has been shown as having two separate leadframes, it will be readily appreciated that a suitable MCM can have only two or alternatively four or more leadframes, and that a suitable SIP can have three or more leadframes.

Figure 5A:
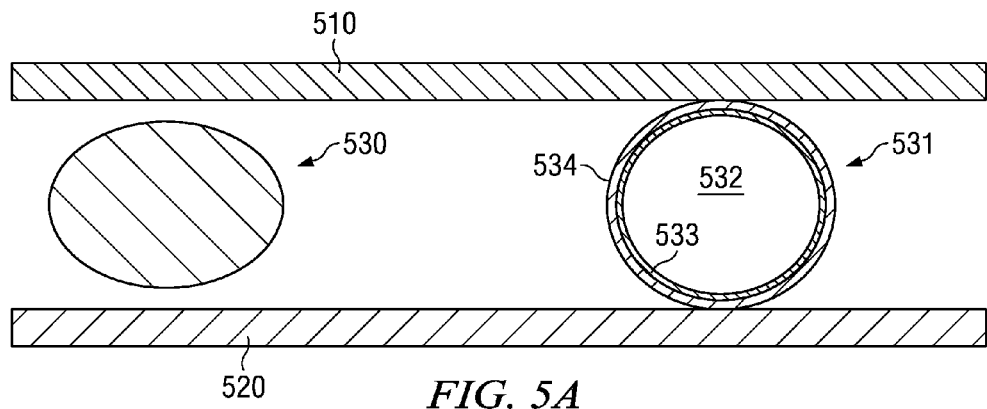
FIG. 5A illustrates in side cross-sectional view various exemplary direct electrical connectors in the form of balls according to some embodiments of the present invention.

Various kinds of direct electrical connectors that electrically connect and also control the local distance between leadframes will now be provided. Moving next to FIG. 5A various exemplary direct electrical connectors in the form of balls are illustrated in side cross-sectional view according to some embodiments of the present invention. In general, various direct electrical connectors are used in the present invention to couple two leadframes, such as top leadframe 510 to bottom leadframe 520. Such direct electrical connectors might be in the form of one or more ordinary solder balls 530. A significant issue with using ordinary solder balls, however, is that such solder balls tend to flatten and deform when they are reflowed, which is reflected in the flattened egg shape of solder ball 530 as depicted. As such, the height between top leadframe 510 and bottom leadframe 520 might not be easily controlled by way of using only ordinary solder balls 530.

In contrast, the use of at least some polymeric solder balls 531 is preferred. To enable a more reliable solder mounting of one leadframe to another, each solder joint can incorporate a polymeric solder ball having a polymeric core 532 with a copper shell 533 followed by an outer solder layer 534. Applying an industry standard reflow process, a significantly higher strength joint can be created due to the flexibility of the polymeric core. Hence, a significantly longer fatigue life can be achieved than a conventional solder joint. In addition, the polymeric core and copper shell do not tend to flatten or deform when the ball is reflowed, such that the height between leadframes can be more readily controlled by using such balls 531. Typical of such polymeric core solder balls are those commercially available by Sekisui Corporation of Japan. Further details regarding the use of polymeric core solder balls can be found in, for example, U.S. patent application Ser. No. 11/897,971 entitled "High Strength Solder Joint Formation Method For Wafer Level Packages And Flip Applications," which is incorporated by reference herein for all purposes.

In some embodiments, only polymeric core solder balls 531 are used for all direct electrical connectors that couple two or more leadframes together in a particular application. In other embodiments, some direct electrical connectors can be polymeric core solder balls, while other direct electrical connectors in the same package can be of a different type, such as standard solder balls or tabs, for example. In the event that other direct electrical connectors do not provide adequate structural rigidity or surety with respect to distance control, it is preferable that a sufficient number of the direct electrical connectors be polymeric core solder balls. In the event that a mixture of conventional and polymeric core solder balls are used, a strategic arrangement designed to maximize placement of the polymeric core balls to ensure a suitable height displacement between leadframes can be used. In some embodiments, the balls can be lead-free, as may be desired.

Figure 5B:
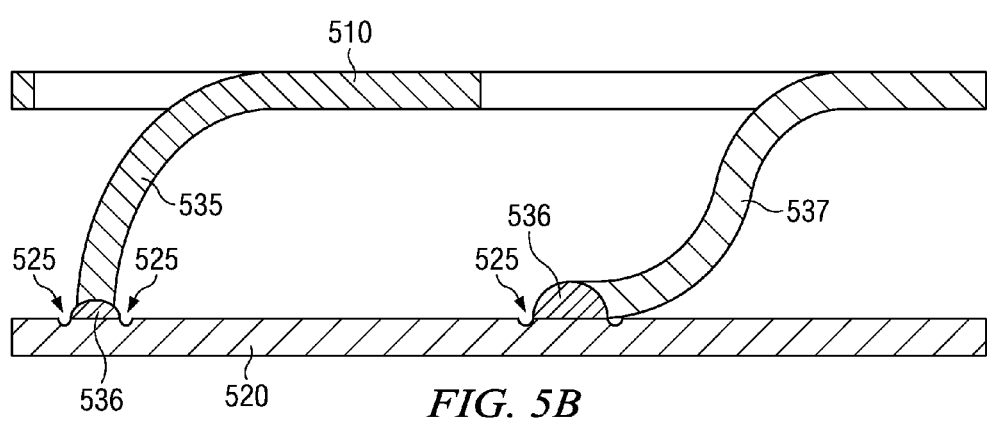
FIG. 5B illustrates in side cross-sectional view various exemplary direct electrical connectors in the form of tabs according to some embodiments of the present invention.

One alternative to polymeric core solder balls can be the use of tabs to electrically connect and reliably space apart two separate leadframes. Continuing with FIG. 5B various exemplary direct electrical connectors in the form of tabs are illustrated in similar side cross-sectional view. Again, various direct electrical connectors are used to electrically couple and control spacing between two leadframes, such as top leadframe 510 to bottom leadframe 520. Instead of balls, such direct electrical connectors can be in the form of tabs, such as N-tab 535 or S-tab 537. As shown, N-tab 535 might be integrally formed with top leadframe 510, such that the N-tab is bent downward to be bonded at its distal end onto bottom leadframe 520 by way of a suitable solder bond 536. A moat or other indentation 525 can be formed around the bond location in bottom leadframe 520 to facilitate such a tap bonding, as will be readily appreciated by one skilled in the art.

Alternatively, or in addition to one or more N-tabs, one or more S-tabs 537 can also be used as direct electrical connectors between leadframes 510 and 520. S-tab 537 can be a somewhat longer piece of metal formed into an "S" shape that is similarly integrally formed from one leadframe and bonded at one end to the other leadframe by a suitable solder bond 536. Again, a suitable moat or other indentation 525 can be formed into bottom leadframe 520 for this purpose. Both N-tabs 535 and S-tabs 537 can be etched, stamped, punched, bent and/or otherwise formed in one or both leadframes via a suitable formation process. While solder bonds 536 have been illustrated individually, such that solder balls might be used, it will be readily appreciated that a solder paste can be formed in the production of many bonds. In some embodiments, a suitable ultrasonic welding process can alternatively be used to attach the end or one or more tabs to an opposing leadframe, such as where both bonded components are copper, as will be readily understood.

It will be readily appreciated that some regions of one or both leadframes can be downset or otherwise located away from the general primary plane of the leadframe. In such instances, the size of the respective ball, tab, or other direct electrical connector can be adjusted appropriately to control the exact distance or offset between leadframes that is desired for any particular location. For example, different gap distances between leadframes can be controlled accurately by using different polymeric solder ball heights. While a wider variety of distances might be controlled by polymer solder balls and/or tabs, relatively short distances between leadframes might also result in the ability to use other types of direct electrical connectors, such as double stamps or embosses, for example.

Figure 5C:
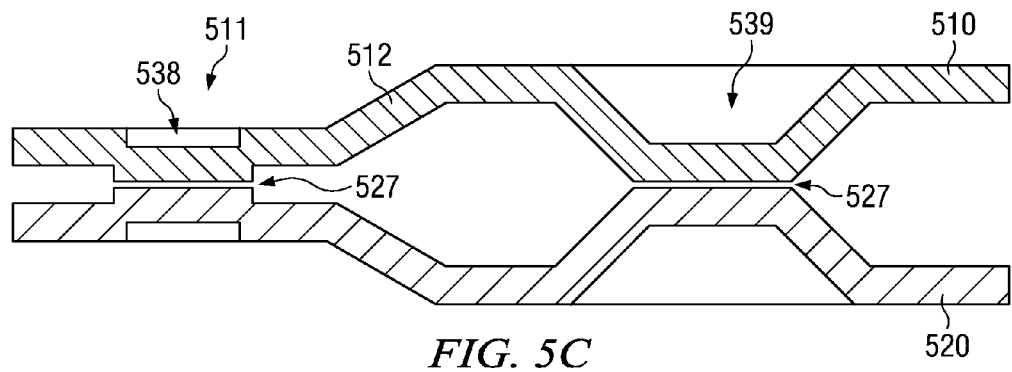
FIG. 5C illustrates in side cross-sectional view various exemplary direct electrical connectors in the form of stamps and embosses according to some embodiments of the present invention.

FIG. 5C illustrates in side cross-sectional view various exemplary direct electrical connectors in the form of stamps and embosses according to some embodiments of the present invention. Again, various direct electrical connectors are used to electrically couple and control spacing between two leadframes, such as top leadframe 510 to bottom leadframe 520. Instead of balls or tabs, such direct electrical connectors can take the form of stamps or embosses in the leadframes themselves. Such stamping or embossing techniques can be used in one or both leadframes, and again are typically restricted to locations where the leadframes are relatively close together. For example, it is thought that using solely stamping and/or embossing techniques to form direct electrical connectors can be limited to localized distances or standoffs between leadframes that are about three times the thickness of a leadframe. In some embodiments, a direct electrical connector between leadframes is formed when both leadframes are stamped or embossed at the same location, such that the stamps or embossments meet between the leadframes.

In locations where the leadframes are quite close, such as where one or both leadframes are downset toward each other, then a pair of half-stamps can be used to form a direct electrical connection. For example, top leadframe 510 can have a downset region 511 coupled to the rest of the leadframe by connecting portion 512. Bottom leadframe may or may not have a similar downset or offset and connecting portion. A half-stamp 538 can then be formed in both leadframes at the same location, such that they meet in the middle. Such stamps or half-stamps can be formed in both leadframes via any suitable stamping process, as will be readily appreciated by those skilled in the art. A small gap 527 between leadframes at the half-stamp location 538 might exist, such as where solder or other bonding component might reside to help form a permanent electrical connection. Alternatively, the leadframes can be bonded at half-stamp location 538 via an ultrasonic weld, such as where both leadframes are formed from copper, for example.

In some embodiments, an embossment 539 might be formed in top leadframe 510 where a direct electrical contact with bottom leadframe 520 is desired. As in the case of the half-stamps, a pair of embossments might be formed such that the embossed portions of both leadframes extend toward the other leadframe and meet in the middle or thereabout. Again, a small gap 527 might be left between the embossments such that solder can be used to form a permanent connection between the leadframes at the embossed region. In addition to stamping, half-stamping and embossing, it will be understood that similar techniques, such as coining or bending, can be used to form direct electrical connectors in the leadframes themselves.

In addition to polymeric solder balls, tabs, stamps and embossments, till further ways of providing direct electrical connectors that control the distance or standoff between stacked leadframes are contemplated. For example, a solder paste with structural fillers can be used. Either polymeric solder balls or simple copper balls can be mixed into a solder paste for structural integrity, such that the distance between leadframes is maintained. Such polymeric or copper balls can have a diameter of about three mils, for example, although other sizes are also possible. As another alternative, a pure silicon die can be used to provide separation and insulation between leadframes. Such a die can be, for example, 10 by 10 by 5 mils, among other possible sizes, and may provide customized leads or traces where desired.

Figure 5D:
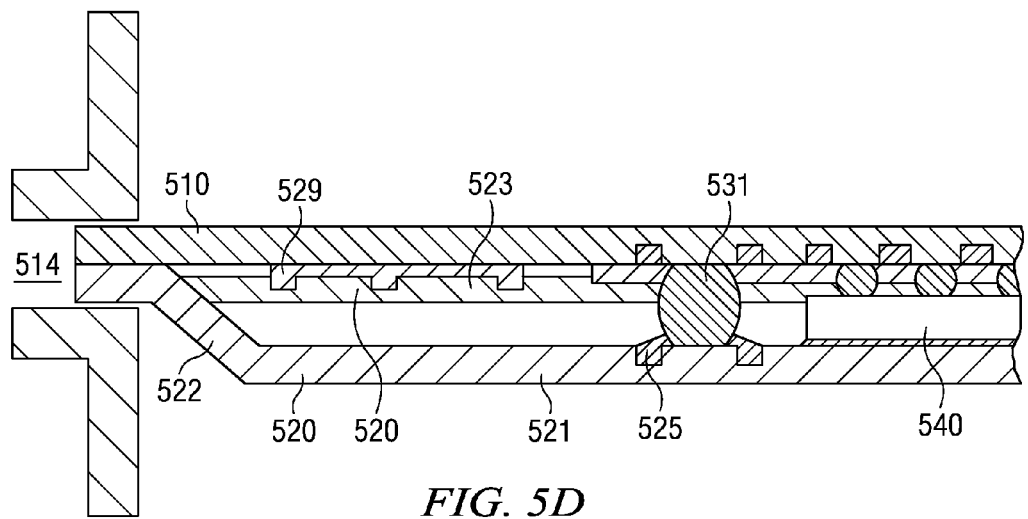
FIG. 5D illustrates in side cross-sectional view various exemplary direct electrical connectors in the form of half-etched features according to some embodiments of the present invention.

As yet another way of providing direct electrical connectors and reliable distance or standoff between multiple leadframes, a solder paste and half-etch arrangement can be used, with the half-etch being performed in a pattern in one or both leadframes. Such an arrangement can result in up to a six to eight mil separation between leadframes in some locations. Referring now to FIG. 5D, various exemplary direct electrical connectors in the form of half-etched features according to some embodiments of the present invention are illustrated in side cross-sectional view. Top leadframe 510 and bottom leadframe 520 can come into direct contact at one or more locations, such as, for example, tie bar region 514. Of course, portions of such tie bar regions can be removed from one or both leadframes at a later process step. As shown, while top leadframe 510 can remain substantially planar for a given region, bottom leadframe 520 may include a relatively downset portion 521 and a relatively elevated portion 523, and can also include one or more connecting portions 522 that can couple the two. One of these downset or elevated portions can be designated as the general plane defined by bottom leadframe 520, although such a designation is not critical. Of course, such a general plane may reside on another level instead.

Because the distance or offset between top leadframe 510 and bottom leadframe 520 is relatively large for downset portion 521, one or more tabs (not shown) and/or polymer balls 531 can be used to electrically couple and control the distance between leadframes in such locations. Again, a localized moat or indentation 525 can be used for polymer balls 531 or any other soldered contact. The distance or offset between leadframes can also be controlled in regions where a particular component resides between the leadframes, such as primary die 540. Where the two leadframes are close, however, a portion of one or both leadframes can be etched away in a pattern so as to control the electrical relationships and contacts between leadframes. As shown, an upper region of elevated portion 523 of the bottom leadframe 520 is etched away in some locations, with one or more features 524 being left where electrical contacts with the upper leadframe 510 are desired. A patterned solder paste 529 can be provided to bond the contacts between the various bottom leadframe features 524 and the top leadframe 510.

Figure 5E:
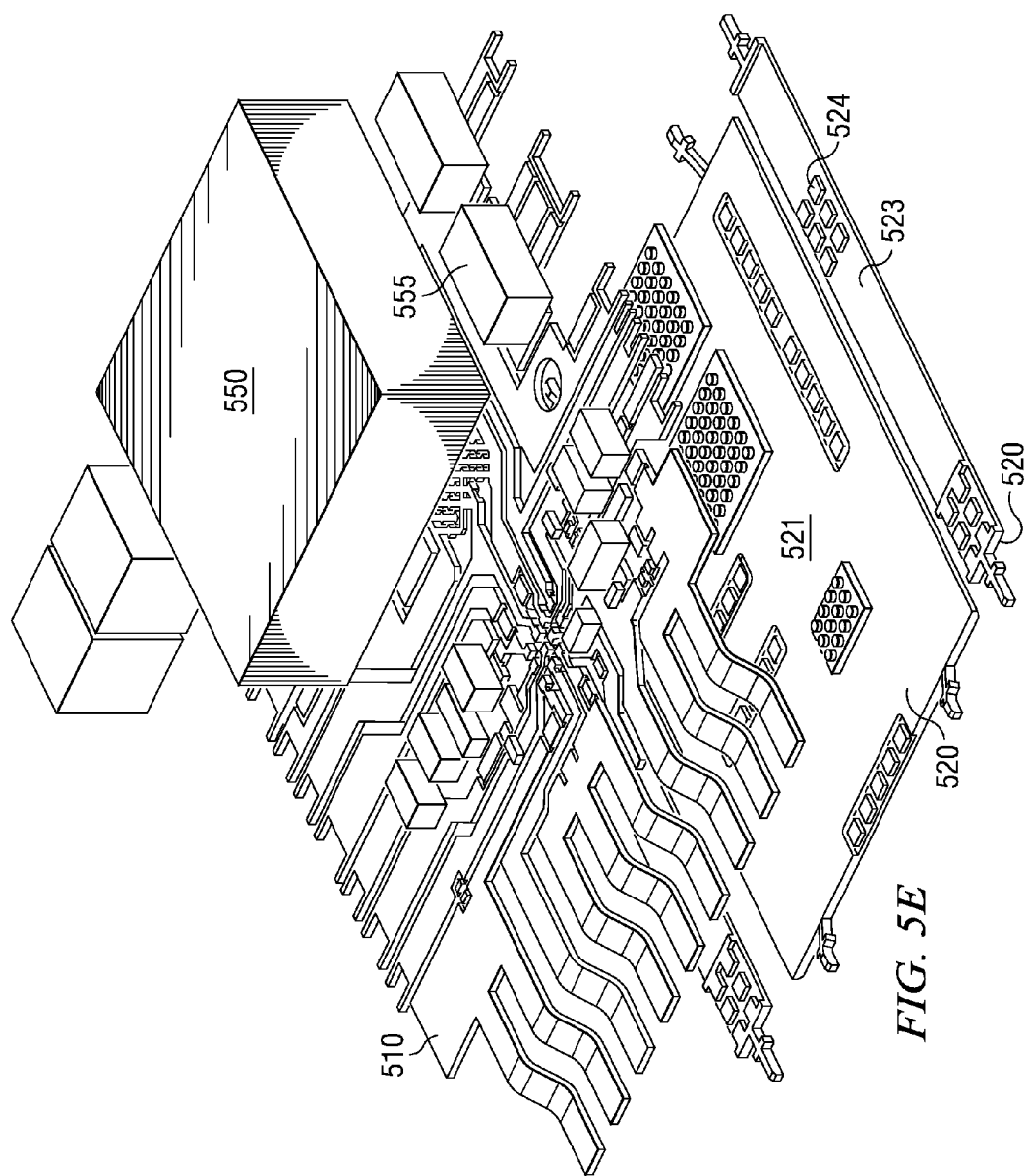
FIG. 5E illustrates in exploded top perspective view a partial MCM package having the various exemplary direct electrical connectors in the form of half-etched features of FIG. 5D according to one embodiment of the present invention.

FIG. 5E illustrates in exploded top perspective view a partial MCM package having the various exemplary direct electrical connectors in the form of half-etched features from FIG. 5D. Top leadframe 510 can have a variety of additional components formed thereupon, such as inductor 550 and one or more capacitors 555, among various other items. Bottom leadframe 520 can include downset region 521 having one or more die attach pads, each with a die attached thereto, as well as other possible features. Bottom leadframe can also generally include elevated region 523, which can be half-etched in various locations such that one or more protruding features 524 are formed. As will be readily appreciated, such features 524 can be bonded via a solder paste (not shown) to one or more locations on the bottom side of top leadframe 510 to form direct electrical connectors that also control the spacing between the leadframes. One or more electrical leads or connections on top leadframe 510 can then run across the half-etched locations of elevated region 523 and be electrically isolated therefrom. A final molding or encapsulant between the two leadframes (not shown) can provide further structural rigidity and insulation for such half-etched regions where contact between the two leadframes is not desired.

Figures 6A, 6B:
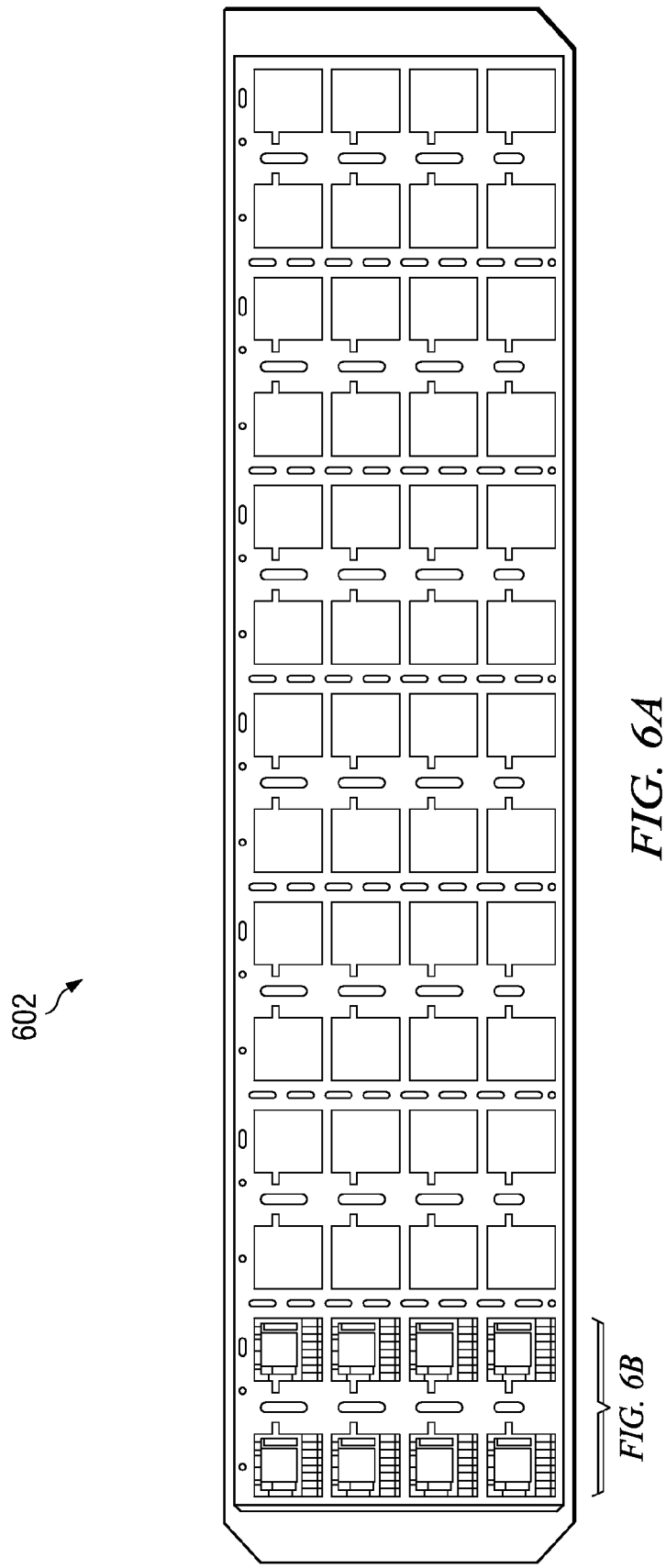
FIG. 6A illustrates in top plan view an exemplary multiple leadframe panel containing a plurality of device arrays, each having a plurality of electrical interconnect patterns according to one embodiment of the present invention.
FIG. 6B illustrates in top plan view an exemplary multiple leadframe device array from the panel FIG. 6A according to one embodiment of the present invention.
Figure 6B:
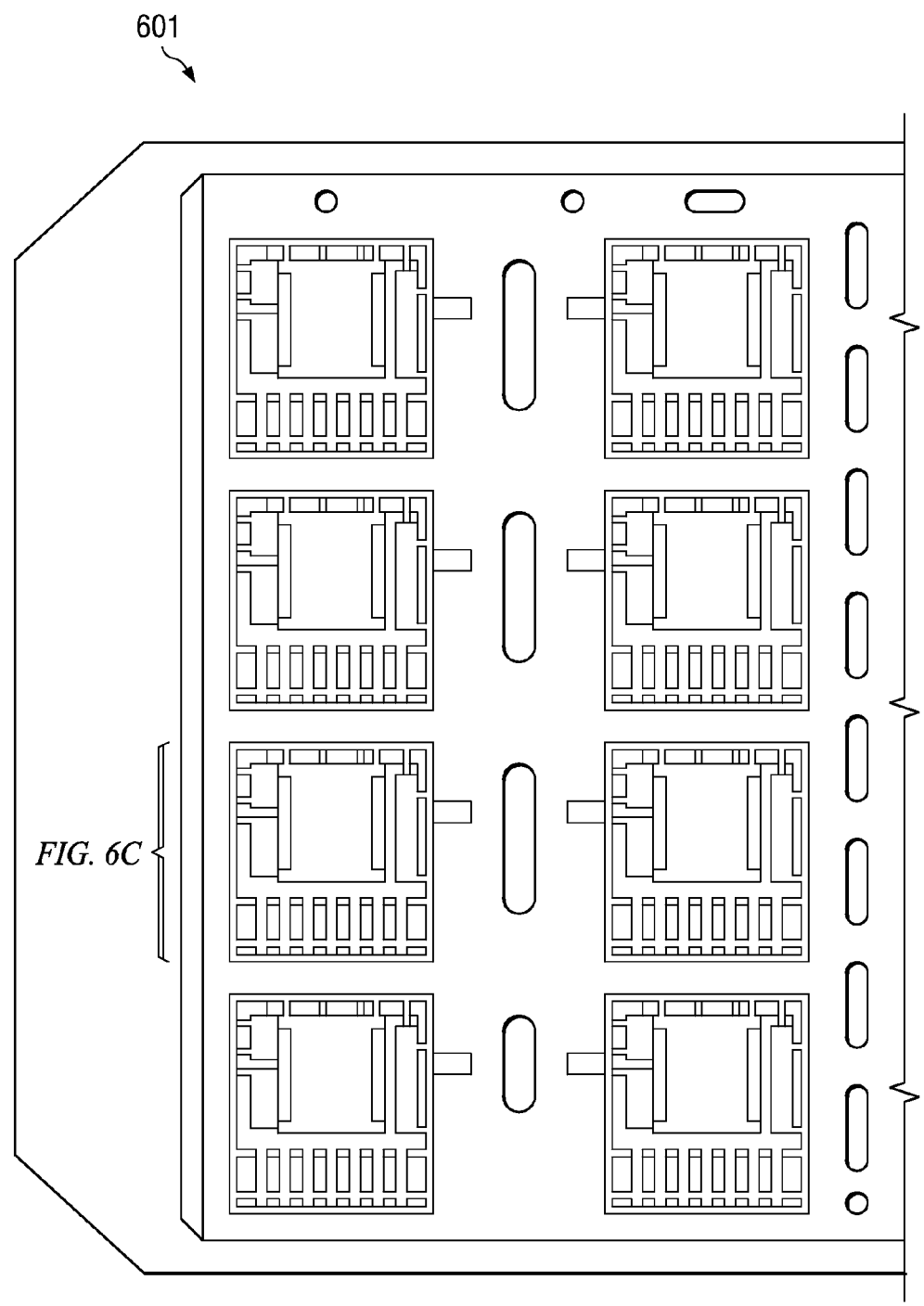
Figure 6C:
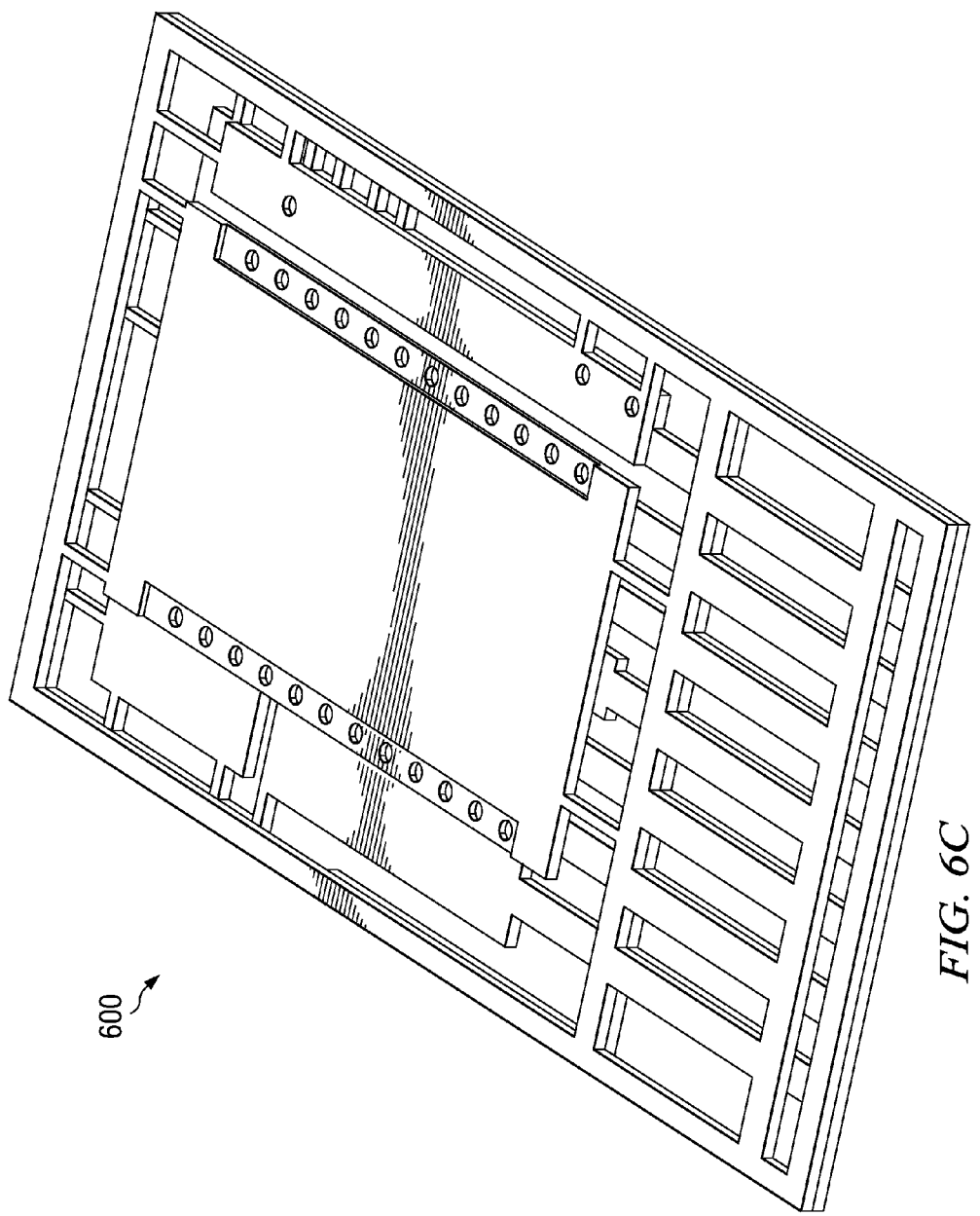
FIG. 6C illustrates in top plan view an exemplary multiple leadframe electrical interconnect pattern from the device array of FIG. 6B according to one embodiment of the present invention.

Turning next to FIGS. 6A-6C, various structures representative of the mass production of multiple leadframe packages are provided, all in top plan view. FIG. 6A illustrates an exemplary multiple leadframe panel 602 containing a plurality of device arrays, each having a plurality of electrical interconnect patterns, FIG. 6B illustrates an exemplary multiple leadframe device array 601 from the panel FIG. 6A, and FIG. 6C illustrates an exemplary multiple leadframe electrical interconnect pattern 600 from the device array of FIG. 6B. As will be readily appreciated, the multiple leadframe electrical interconnect pattern 600 generally corresponds to and can be identical or substantially similar to the partial multiple leadframe package 100 of FIGS. 1A and 1B discussed above. As shown in FIGS. 6A-6C, a typical set of multiple leadframe packages can involve the formation of a copper leadless leadframe strip or panel 602 that is patterned to define a plurality of device arrays or matrices 601 of individual semiconductor device areas or electrical interconnect patterns 600.

Panel 602 can be formed by etching one or more relatively thin conductive metal layers, such as copper, into specific electrical interconnect patterns, as shown. Such metal layers for panel 602 can have a thickness of about 100 to 300 microns, such that the entire finished panel is relatively thin, yet still has enough structural integrity to be transported about and processed without breaking. Although the primary function of the various patterns, that being to provide electrical interconnects between components, can be accomplished with patterns that are substantially thinner than those in panel 602, the typical thicknesses of these panels are typically much larger, such that the panels are sturdy enough to be readily processed. One drawback of panels that are thicker than necessary for their primary function, however, is that additional material is used, which can drive up materials costs. The drawback of such added materials costs can be aggravated when such panels are made from more valuable or expensive metals, such as copper, silver and/or gold.

Figure 7:
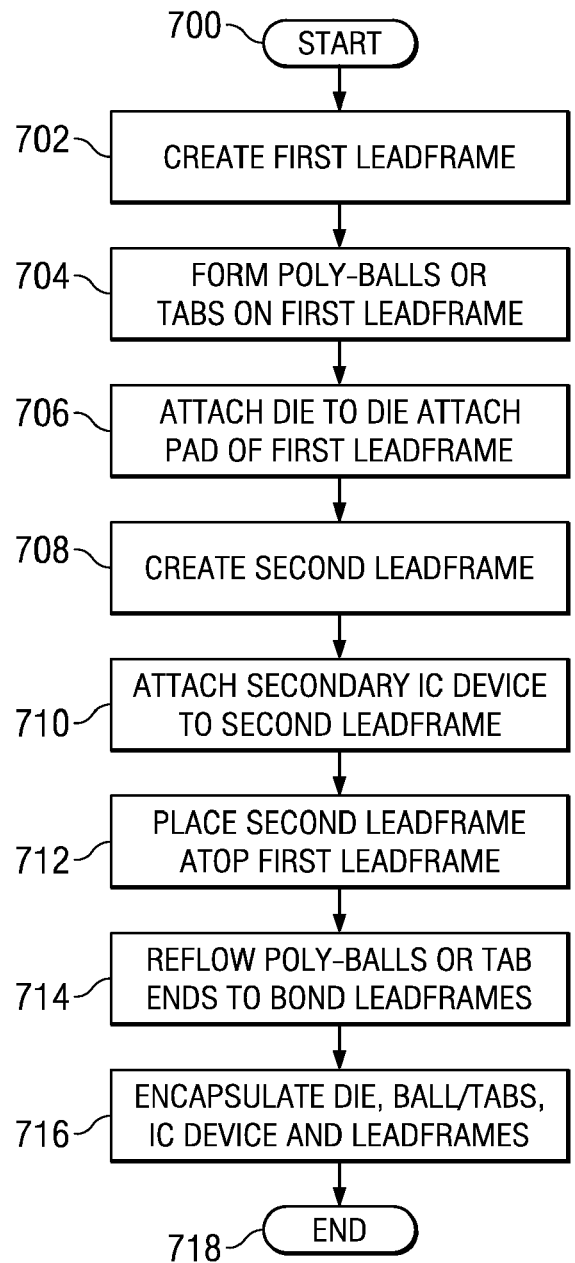
FIG. 7 presents a flowchart of an exemplary method of manufacturing the IC device of FIG. 3B according to one embodiment of the present invention.

Turning now to FIG. 7, a flowchart of one exemplary method of manufacturing the IC device of FIG. 3B according to one embodiment of the present invention is provided. It will be readily appreciated that the method provided herein is merely exemplary, and that the present invention may be practiced in a wide variety of suitable ways. While the provided flowchart may be comprehensive in some respects, it will be readily understood that not every step provided is necessary, that other steps can be included, and that the order of steps might be rearranged as desired by a given manufacturer, as desired.

After start step 700, a first leadframe is created at process step 702. At subsequent process step 704, a plurality of direct electrical connectors are formed on the first leadframe. As provided in examples above, such direct electrical connectors can be polymeric solder balls and/or tabs, such as N-tabs and/or S-tabs, with balls and/or tab ends soldered to respective leadframes as appropriate. At following process step 706, a primary die is attached to a DAP of the first leadframe. At process step 708, a second leadframe is created, and at subsequent process step 710, one or more secondary IC devices are attached to the second leadframe. Again, such secondary IC devices can be one or more additional dice, inductors, and/or capacitors, among other components. At following process step 712, the second leadframe can be placed atop or otherwise stacked against the first leadframe, and the poly-balls and/or tabs can be reflowed at process step 714 to bond the leadframes together. Again, the poly-balls and/or tabs are preferably structured in a particular manner such that the distance between the leadframes after the bonding process is controlled. Finally, an encapsulant can be provided at process step 716 to encapsulate the various dice, leadframes, connectors, and/or secondary IC components.

The method then ends at end step 718. As will be appreciated, the foregoing method can be made to reflect some or all details of the stages depicted in FIG. 3A above. Furthermore, various steps may be performed in a different order, as desired. For example, a second leadframe may be created (i.e., step 708) and one or more secondary devices may be attached to the second leadframe (i.e., step 710) at any point between the listed start step 700 and actual process steps 708 and 710. Of course, alternative method steps and other changes may also be used as well. As another example, the encapsulating or molding step 716 can be performed earlier or even separated out into two separate steps, with a first encapsulant being provided over both leadframes and components therebetween before any secondary IC devices are attached to the second leadframe.

Figure 8A:
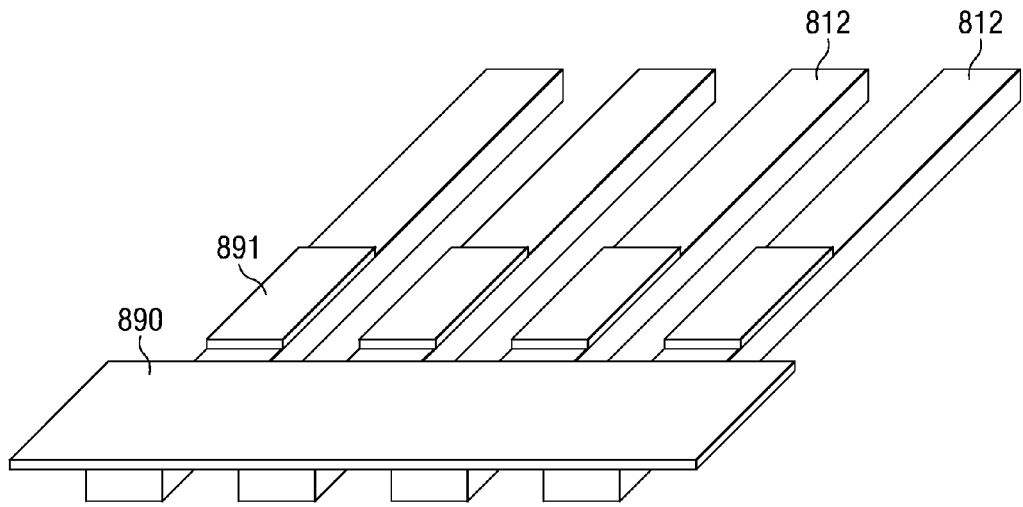
FIG. 8A illustrates in top perspective view an exemplary set of taped electrical leads.

As will be readily appreciated, a variety of additional issues and concerns can arise with respect to the creation of a SIP or MCM such as those provided above. One such issue can be the undesired contacting of electrical traces or components in a vertical direction, such as above or below the general plane defined by a given leadframe. Moving next to FIG. 8A, an exemplary set of electrical leads that are taped is illustrated in top perspective view. Electrical leads 812 can be a set of individual leads that extend together within or from a leadframe, such as a copper leadframe. Such leads 812 can be parallel or extend in the same general direction, and have a length that is significant enough to result in swaying, bending or other relatively slight displacement. As will be understood, such displacements in the various electrical leads 812 can have the potential for leads to contact each other, such that an undesirable short or other crossed contact or connection can occur.

In order to prevent such undesirable shorts or contacts, a piece of lead fixing tape 890 can be distributed across the plurality of electrical leads 812. Such a lead fixing tape 890 serves to maintain the relative distances between the leads 812, such that they do not contact each other in the event of any slight displacements. Although lead fixing tape 890 is shown as being near one end of electrical leads 812, it will be readily understood that the placement of the tape can vary, and that suitable protection can be had for tape placement in other locations, such as along the general center of the leads.

Unfortunately, lead fixing tape 890 can have some limitations. That is, while lead fixing tape 890 can guard against shorts or other undesirable contacts in two dimensions along a general plane defined by the set of electrical leads 812, displacements into a third dimension outside (i.e., above or below) the plane defined by the electrical leads might not be fully guarded against by the lead fixing tape. In such instances, a tape location at the end of the electrical leads may guard against a short or other undesirable contact above a given lead near its end, but not below that end, and not above or below that lead near its middle or other end. As such, one or more pieces of additional tape 891 can be provided on the top and/or bottom surfaces of various leads to prevent unwanted shorts or contacts in a direction that is generally perpendicular to a plane defined by the electrical lead and/or tape.

Figure 8B:
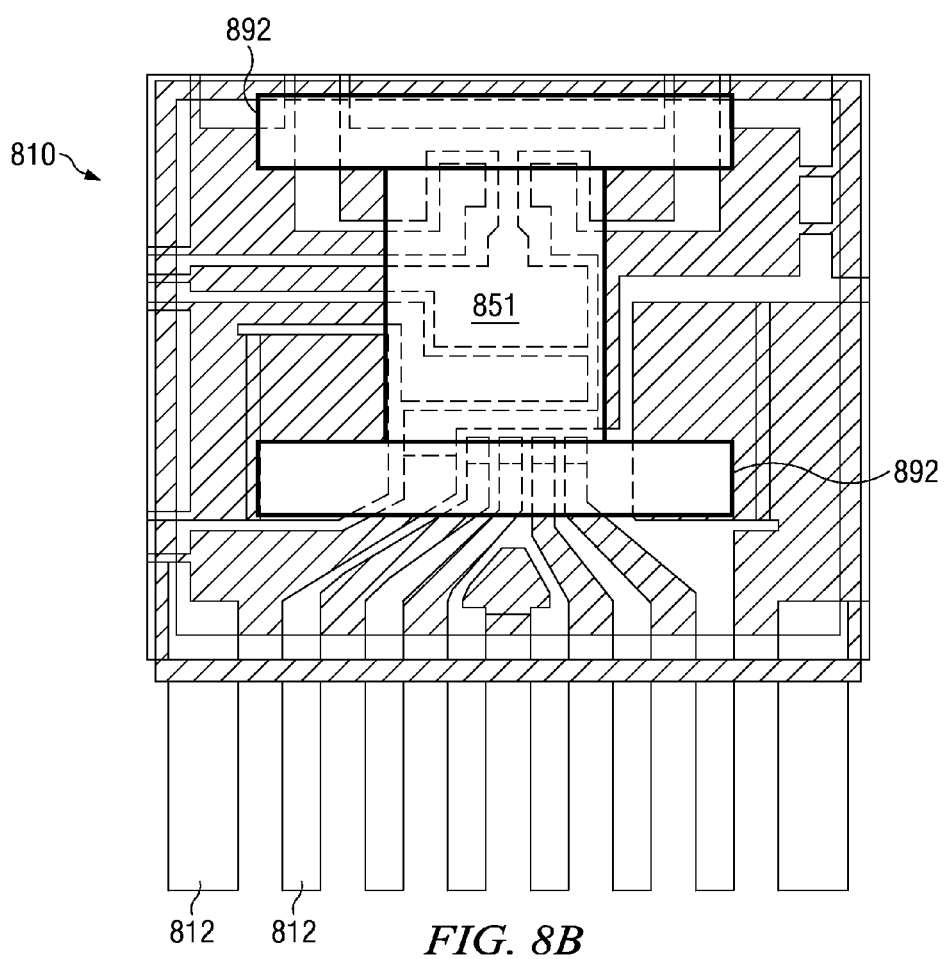
FIG. 8B illustrates in top plan view an exemplary top leadframe having a plurality of electrical lead regions that are taped according to one embodiment of the present invention.

FIG. 8B illustrates in top plan view an exemplary top leadframe having a plurality of electrical lead regions that are taped according to one embodiment of the present invention. Top leadframe 810 can have a variety of individual leads 812 and electrical regions thereon. While a primary die, direct electrical connectors and a bottom leadframe (not shown) can all be located beneath top leadframe 810, various regions atop the leadframe can be designated for one or more additional components. For example, region 851 can be the location where an inductor (not shown) is to be affixed on the top surface of top leadframe 810. Because contact between the outer surface of the inductor and various electrical leads and traces on top leadframe 810 is not desired, one or more broad strips of lead fixing, strip or insulation tape 892 can be placed across the top of various regions of the top leadframe accordingly. As such, lead fixing, strip or insulation tape 892 is distributed across top leadframe 810 such that it insulates the top leadframe from one or more electrical contacts in a direction perpendicular to a plane defined by the tape, that being upward in the general direction of an inductor that is placed at inductor region 851.

Similar insulation or lead fixing tapings can be made to similarly insulate one or more other top or bottom leadframe portions from unwanted shorts or other contacts in a vertical direction. In addition to lead fixing or insulation tape, as exemplified above, other items can be used to accomplish a similar purpose. Such other items can include the actual encapsulant or molding compound, although reliance on this approach can be sketchy in some instances. Other more localized approaches, which may be encapsulated eventually as well, can include the use of raw silicon as a spacer, as well as drops of non-conductive epoxy at critical locations.

Other issues and concerns that can arise with respect to the creation of such an SIP or MCM having multiple stacked leadframes include the frequent or repetitive reflowing of solder contacts as various components or layers are introduced. This can cause issues with earlier bonded components in some instances. For example, in the event that a primary die is affixed to a die attach pad early in the formation process, subsequent solder reflows for the introduction of new parts or layers can have an adverse impact on the originally placed primary die.

Figure 9A:
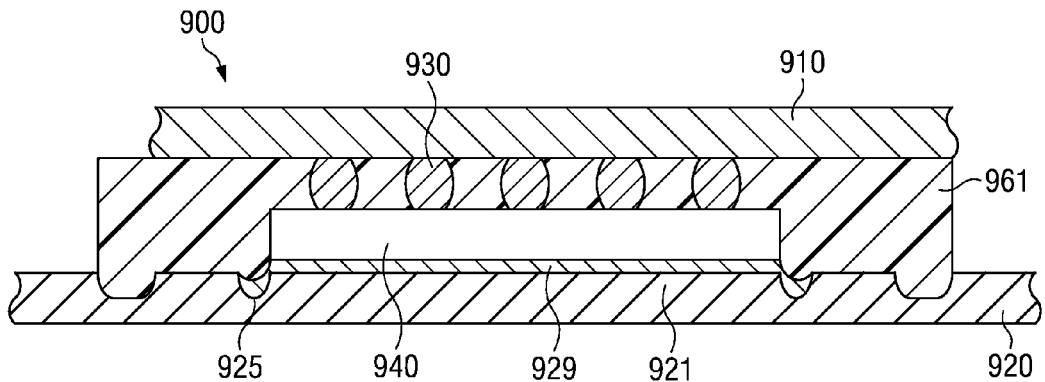
FIG. 9A illustrates in side cross-sectional view an exemplary encapsulated multiple leadframe component according to one embodiment of the present invention.

Turning next to FIG. 9A, an exemplary encapsulated multiple leadframe component is shown in side cross-sectional view. It will be readily appreciated that various parts and features from multiple leadframe component 900 have not been shown for purposes of simplicity. Among other items and features, multiple leadframe component 900 can include a top leadframe 910, a bottom leadframe 920 having a die attach pad 921, a primary die 940 and a mold or encapsulant 961. Primary die can be bonded to top leadframe 910 by a plurality of solder bumps 930, and also bonded to die attach pad 921 by a solder paste layer 929. A moat or indentation 925 can be formed around die attach pad 921 to contain any overflow of solder paste layer 929 that might occur during a reflow process. Multiple leadframe component 900 can be, substantially similar to or a suitable variation of that which is shown in phase 306 of FIG. 3C above, for example. In some embodiments, one or more additional items can be added to multiple leadframe component 900 in the creation of an overall SIP or MCM.

As will be understood, the addition of one or more additional items to the finished phase of multiple leadframe component 900 can result in the additional reflowing of any solder in component 900, such as solder bumps 930 and/or solder paste layer 929. Such an additional reflow or reflows can result in undesirable consequences, such as the "floating" of primary die 940 on a reflowed solder paste layer 929 that has already been initially set to a preferable state. Thus, the addition of further components atop top leadframe 910 by way of a solder reflow process can add potential instability and problems with respect to initial solder bonds formed for initial components, such as primary die 940.

Figure 9B:
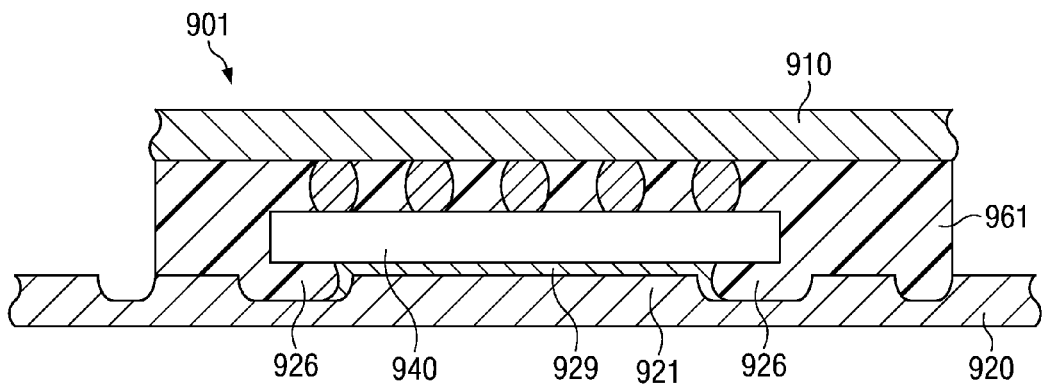
FIG. 9B illustrates in side cross-sectional view an alternative exemplary encapsulated multiple leadframe component having encapsulant between a die and a leadframe having a die attach pad for the die according to one embodiment of the present invention.

Continuing with FIG. 9B, an alternative exemplary encapsulated multiple leadframe component having encapsulant between a die and a leadframe having a die attach pad for the die according to one embodiment of the present invention is similarly illustrated in side cross-sectional view. Multiple leadframe component 901 can be similar to multiple leadframe component 900 from the foregoing example, in that both can have a top leadframe 910, bottom leadframe 920 having a die attach pad 921, encapsulant 961 and a primary die 940 attached to the die attach pad via a solder paste layer 929. Unlike the relatively simple moat 925 in component 900, however, multiple leadframe component 901 utilizes an enlarged undercut 926 that serves as both a solder moat and a fill cavity for encapsulant 961. Such a fill cavity 926 can contain encapsulant after a molding process, which encapsulant then provides structural support to the die with respect to the leadframes during later processes.

As multiple leadframe component 901 is formed, an initial die attach process sees the primary die 940 attached to die attach pad 921 via the solder paste layer 926. A subsequent molding process results in an encapsulant 961 that fills the various spaces between top leadframe 910 and bottom leadframe 920 as usual, which spaces include enlarged undercut 926 between the die 940 and bottom leadframe. Thus, at least a portion of encapsulant 961 is formed between the primary die 940 and a first leadframe, and also between the primary die and the second leadframe. In effect, encapsulant 961 is formed above, below, and around the edges of die 940. In particular, the encapsulant that fills the enlarged undercut region 926 under the die but above the leadframe having the die attach pad prevents or restricts the die from then flowing during subsequent solder reflow procedures with respect to other component regions when solder paste layer 929 might also reflow. This can be accomplished at least in part by using an encapsulant that does not melt or otherwise reflow at the temperatures and conditions used to reflow solder.

Enlarged undercut or fill cavity 926 can be formed by any suitable process, such as those that can be used to create a simple moat 925. Rather than dimension the moat to run along the outer edge of a selected die, however, undercut 926 can be sized by effectively making the die attach pad 921 smaller. Such a formation can be made by way of a half-etch into the bottom leadframe, for example. The resulting overhang or added dimension of the undercut 926 can be about 0.3 to 0.5 millimeters under and around the circumference of the die 940, for example, although smaller or larger dimensions might also be used. Such an undercut dimension can be in addition to an original moat dimension, if desired.

Figure 10B:
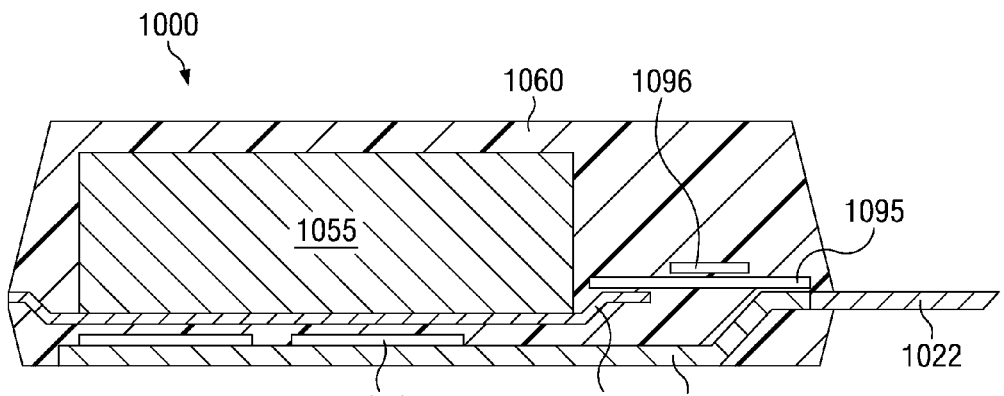
FIG. 10B illustrates in side cross-sectional view the exemplary multiple leadframe component having a daughterboard encapsulated therein of FIG. 10A according to one embodiment of the present invention.
Figure 10A:
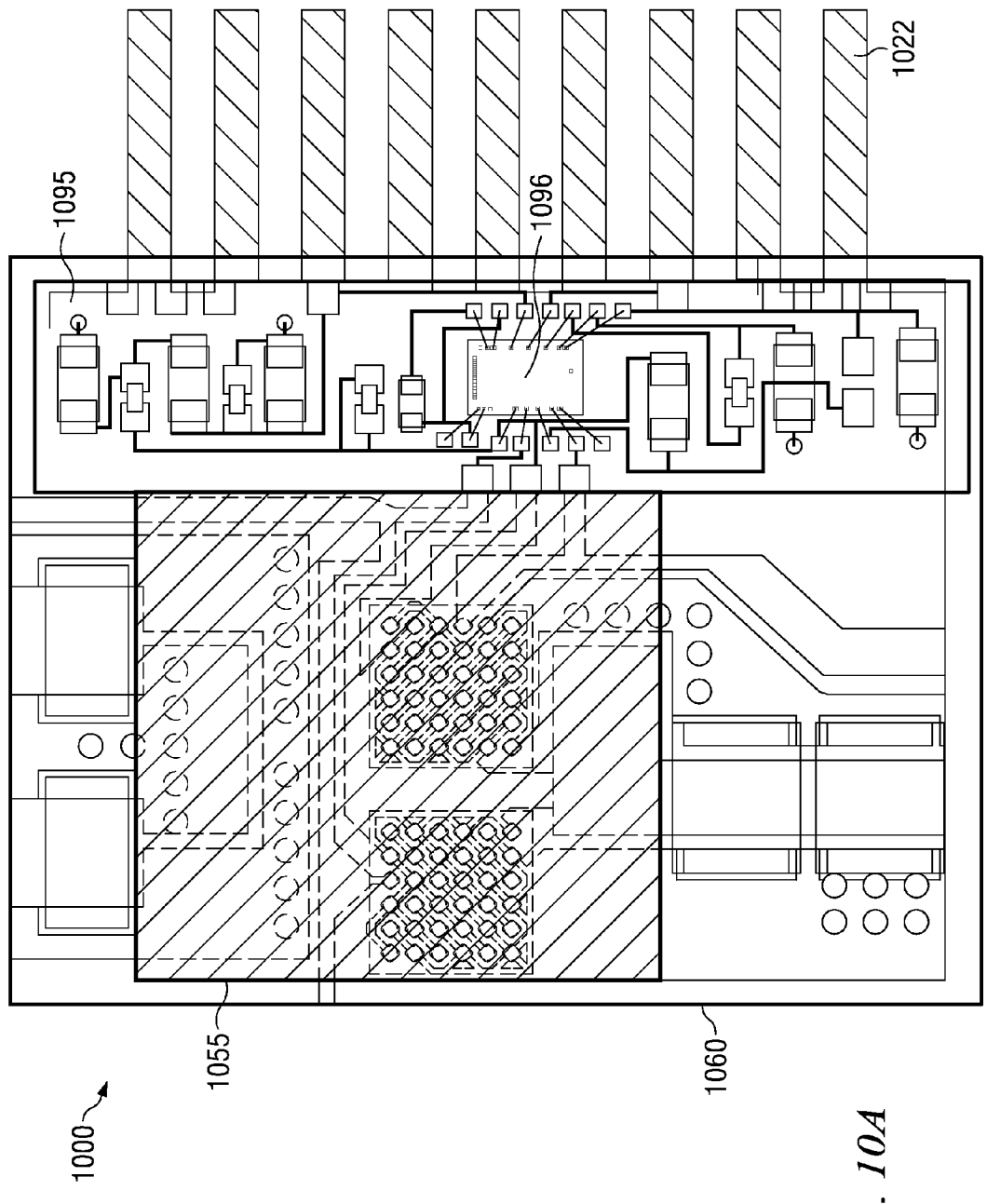
FIG. 10A illustrates in top partial cutaway view an exemplary multiple leadframe component having a daughterboard encapsulated therein according to one embodiment of the present invention.

Moving lastly to FIGS. 10A and 10B, an exemplary multiple leadframe component having a daughterboard encapsulated therein is illustrated in top partial cutaway and side cross-sectional views respectively. Multiple leadframe component 1000 can include a top leadframe 1010, a bottom leadframe 1020, one or more direct electrical connectors therebetween (not shown), one or more primary dice 1040, one or more added components such as inductor 1055, and an encapsulant 1060, similar to various foregoing exemplary multiple leadframe components. In addition, the stacked leadframes 1010, 1020 can generally be arranged within the component or module to support a daughterboard 1095, which daughterboard can have a plurality of additional components or parts 1096 thereon. One or more electrical leads 1022 can extend from the packaged component, and such leads can be associated with one or both of the enclosed and stacked leadframes.

Although daughterboard 1095 is illustrated as being mounted parallel to the top or receiving leadframe 1010, it will be understood that alternative mounting positions and arrangements can also be used. For example, daughterboard 1095 could be mounted perpendicular to the receiving leadframe, so as to save further on space and thereby reduce overall package size.

As will be readily appreciated, such a packaged arrangement having multiple stacked leadframes and an enclosed daughterboard can provide several advantages over traditional arrangements. For example, the leadframe stack region can be used for all high current electrical loop items, while the daughterboard or other suitable PCB can be used for all low current electrical loop items. Such use of a daughterboard or other PCB can result in the ability to utilize more space efficient layouts or designs, which can increase module or packaged component functionality while still remaining within a relatively small overall footprint.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:
1. An integrated circuit package, comprising:
   a first leadframe generally defining a first plane and having a die attach pad adapted to couple to an associated primary die and a first plurality of electrical leads adapted to coupled to one or more contacts on said associated primary die;

a second leadframe generally defining a second plane substantially parallel to and separated from said first plane, said second leadframe having a second plurality of electrical leads adapted to couple to one or more contacts on said associated primary die, one or more contacts on said first leadframe, or both; and a plurality of direct electrical connectors between said first leadframe and said second leadframe, wherein said plurality of direct electrical connectors control the distance between said first and second leadframes.

2. The integrated circuit package of claim 1, wherein said second leadframe is separated from said first leadframe by a distance that remains constant at substantially all locations of both leadframes.

3. The integrated circuit package of claim 1, further including:

an encapsulant that binds and protects various portions of said first leadframe, second leadframe, and plurality of direct electrical connectors.

4. The integrated circuit package of claim 1, wherein said plurality of direct electrical connectors comprises one or more balls having solder and a polymer material therein.

5. The integrated circuit package of claim 1, wherein at least one of said first and second leadframes comprises a leadless leadframe.

6. The integrated circuit package of claim 1, wherein at least one electrical connection to a contact on said primary associated die follows a path that traverses along a portion of said second leadframe, across one of said plurality of direct electrical connectors to said first leadframe, along a portion of said first leadframe, across another of said plurality of direct electrical connectors back to said second leadframe, and along another portion of said second leadframe.

7. The integrated circuit package of claim 1, further including:

said associated primary die;

an additional integrated circuit component coupled to said second leadframe, said additional integrated circuit component selected from the group consisting of a secondary die, a capacitor, an inductor and a daughterboard; and an encapsulant that binds and protects various portions of said primary die, first leadframe, second leadframe, and plurality of direct electrical connectors.

8. The integrated circuit package of claim 7, wherein said encapsulant does not encapsulate said additional integrated circuit component.

9. The integrated circuit package of claim 7, wherein at least a portion of said encapsulant is formed between said associated primary die and said first leadframe, and also between said associated primary die and said second leadframe.

10. An integrated circuit package, comprising:

a first leadframe generally defining a first plane and having a die attach pad adapted to couple to an associated primary die and a first plurality of electrical leads adapted to coupled to one or more contacts on said associated primary die;

a second leadframe generally defining a second plane substantially parallel to and separated from said first plane, said second leadframe having a second plurality of electrical leads adapted to couple to one or more contacts on said associated primary die, one or more contacts on said first leadframe, or both; and a plurality of direct electrical connectors between said first leadframe and said second leadframe, wherein said plurality of direct electrical connectors control the distance between said first and second leadframes, wherein said plurality of direct electrical connectors comprises one or more metal tabs that extend from one leadframe to the other.

11. An integrated circuit device, comprising:

a first die having a plurality of contacts thereon;

a first leadframe defining a first plane and having a die attach pad coupled to said first die and a first arrangement of one or more electrical leads coupled to said plurality of contacts;

a second leadframe defining a second plane separate from said first plane, said second leadframe having a second arrangement of one or more electrical leads coupled to said plurality of contacts;

a plurality of direct electrical connectors between said first leadframe and said second leadframe, wherein said plurality of direct electrical connectors control the distance between said first and second leadframes;

an additional integrated circuit component coupled to at least said second leadframe, said additional integrated circuit component selected from the group consisting of a second die, a capacitor and an inductor; and an encapsulant that binds and protects various portions of said first die, first leadframe and second leadframe.

12. The integrated circuit device of claim 11, wherein said plurality of direct electrical connectors comprises one or more balls having solder and a polymer material therein.

13. The integrated circuit device of claim 11, wherein said encapsulant does not encapsulate said additional integrated circuit component.

14. The integrated circuit device of claim 11, wherein said plurality of direct electrical connectors comprises one or more metal tabs that extend from one leadframe to the other.

15. The integrated circuit device of claim 11, wherein at least one of said first and second leadframes comprises a leadless leadframe.

16. The integrated circuit device of claim 11, further including:

a third leadframe defining a third plane separate from said first and second planes, said third leadframe having a third arrangement of one or more electrical leads coupled to a plurality of contacts within said integrated circuit device.

17. The integrated circuit device of claim 11, further including:

lead fixing tape distributed across at least one of said leadframes, wherein said lead fixing tape insulates its respective leadframe from one or more electrical contacts in a direction perpendicular to a plane defined by said lead fixing tape.

18. A method of manufacturing an integrated circuit device, comprising:

creating a first leadframe having a die attach pad and a first plurality of electrical leads;

forming a plurality of direct electrical connectors directly onto said first leadframe;

attaching a first die to said die attach pad;

creating a second leadframe having a second plurality of electrical leads;

attaching a secondary integrated circuit component to said second leadframe, said secondary integrated circuit component selected from the group consisting of a second die, a capacitor and an inductor;

placing said second leadframe atop said plurality of direct electrical connectors formed on said first leadframe;

reflowing a portion of at least some of said plurality of direct electrical connectors such that said second leadframe is bonded to said first leadframe, wherein said plurality of reflowed direct electrical connectors control the distance between said first and second leadframes and providing an encapsulant around various portions of said first die, first leadframe and second leadframe.

19. The method of claim 18, wherein said step of attaching a secondary integrated circuit component is performed after said providing an encapsulant step.

20. The method of claim 18, wherein said plurality of direct electrical connectors comprises one or more balls having solder therein, one or more metal tabs that extend from one leadframe to the other, or both.

* * * * *